United States Patent
Chang

(10) Patent No.: US 7,985,001 B2
(45) Date of Patent: Jul. 26, 2011

(54) LED LIGHT FIXTURE AND METHOD FOR MANUFACTURING THE SAME

(75) Inventor: Chia-Shou Chang, Taipei Hsien (TW)

(73) Assignee: Foxconn Technology Co., Ltd., Tu-Cheng, New Taipei (TW)

( * ) Notice: Subject to any disclaimer, the term of this patent is extended or adjusted under 35 U.S.C. 154(b) by 317 days.

(21) Appl. No.: 12/399,023

(22) Filed: Mar. 6, 2009

(65) Prior Publication Data

US 2009/0316398 A1 Dec. 24, 2009

(30) Foreign Application Priority Data

Jun. 20, 2008 (CN) .......................... 2008 1 0067939

(51) Int. Cl.
*F21V 1/00* (2006.01)
(52) U.S. Cl. ................... 362/235; 362/249.02; 362/219; 362/800
(58) Field of Classification Search ................... 362/800, 362/806, 808, 235, 166, 181, 184, 200, 201, 362/219, 221, 231, 249.02, 249.06, 249.14, 362/249.16, 249.17, 310, 311.02, 311.06, 362/311.13, 612, 630, 631, 97.3; 257/88, 257/99; 313/500
See application file for complete search history.

(56) References Cited

U.S. PATENT DOCUMENTS

| 7,021,799 | B2 * | 4/2006 | Mizuyoshi | 362/373 |
| 7,078,729 | B2 * | 7/2006 | Suzuki et al. | 257/79 |
| 7,888,852 | B1 * | 2/2011 | Sung | 313/46 |
| 2004/0233671 | A1 * | 11/2004 | Staufert | 362/294 |
| 2006/0007701 | A1 * | 1/2006 | Schoellmann et al. | 362/606 |
| 2006/0171135 | A1 * | 8/2006 | Ishizaka et al. | 362/11 |

* cited by examiner

*Primary Examiner* — Anabel M Ton
*Assistant Examiner* — Danielle Allen
(74) *Attorney, Agent, or Firm* — Frank R. Niranjan

(57) ABSTRACT

An LED light fixture includes a first substrate, a second substrate and a plurality of LED chips. The first substrate, on one side thereof, includes a plurality of spaced first electrodes, a first inner terminal electrically connected to the first electrodes, and a second inner terminal insulated from the first electrodes, and, on another side thereof, a first outer terminal electrically connected to the first inner terminal and a second outer terminal electrically connected to the second inner terminal. The second substrate includes a plurality of spaced second electrodes corresponding to the first electrodes, and a third inner terminal electrically connected to the second electrodes and the second inner terminal. The LED chips are arranged between the first and second substrates and electrically connected to the first and second electrodes of the first and second substrates, respectively.

15 Claims, 8 Drawing Sheets

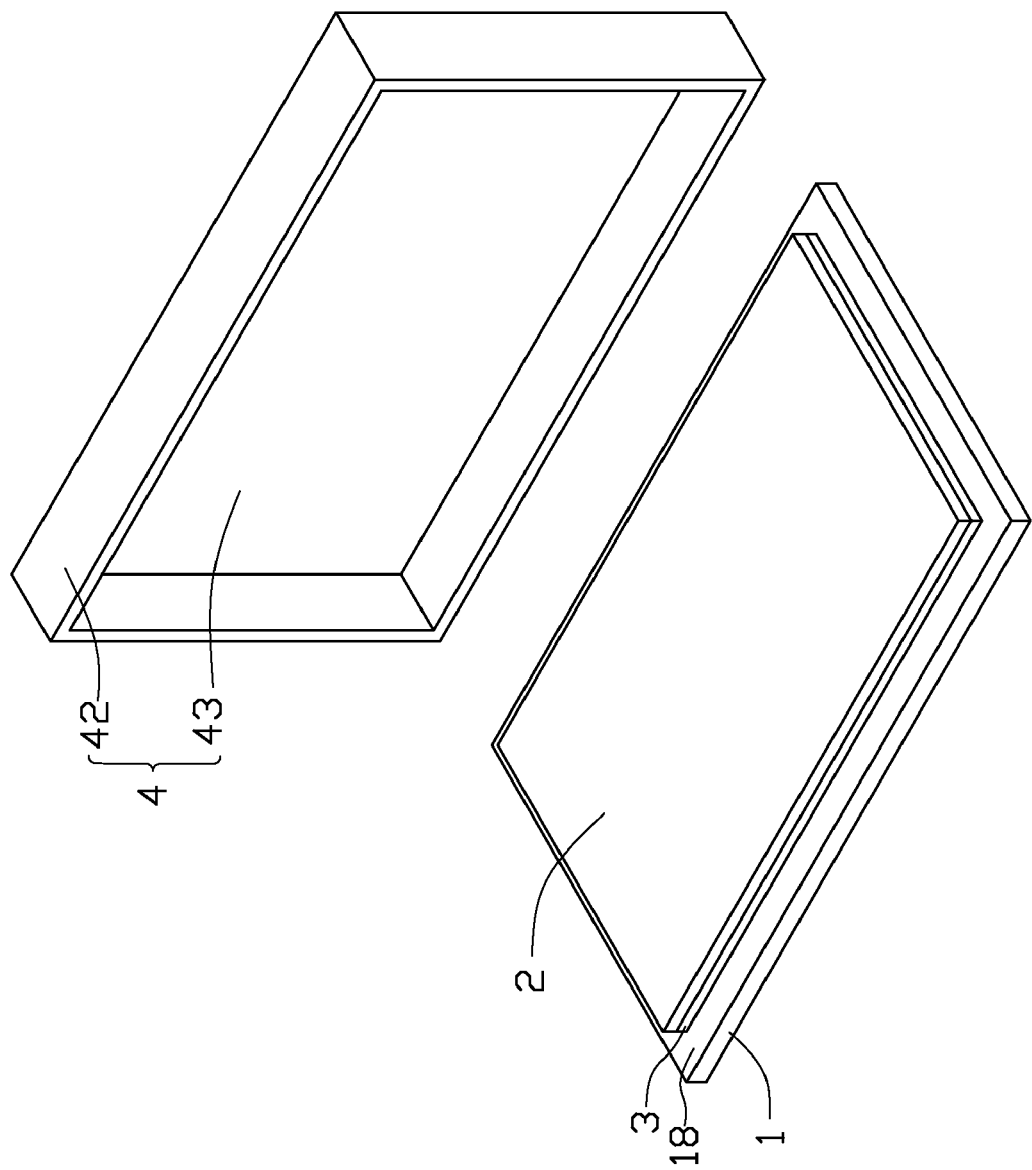

US 7,985,001 B2

LED LIGHT FIXTURE AND METHOD FOR MANUFACTURING THE SAME

BACKGROUND

1. Technical Field

The disclosure generally relates to light fixtures, and particularly to an LED light fixture incorporating a plurality of LEDs and a method for manufacturing the same.

2. Description of Related Art

In recent years, LEDs have been widely used in illumination. Typically, an LED light fixture includes a plurality of LEDs. Each LED includes an LED die arranged in a reflector cup and electrically connected to an external circuit. In addition, the LED die is packaged to protect it from environmental harm and mechanical damage. However, generally, to form the plurality of LEDs, each LED die is individually mounted into the reflector cup and then connected to a circuit board through wire bonding, and finally transparent material is filled into the reflector cup to encapsulate the LED die to form an LED. In other words, the LEDs are formed separately at a time, which is costly, time-consuming and may require substantial amounts of manual labor and/or specialized equipment.

For the foregoing reasons, therefore, there is a need in the art for an LED light fixture and a method for manufacturing the same which can overcome the limitations described.

BRIEF DESCRIPTION OF THE DRAWINGS

FIG. 8 shows a cover assembled onto the first substrate to form the LED light fixture.

DETAILED DESCRIPTION OF THE EMBODIMENTS

Figure 1:
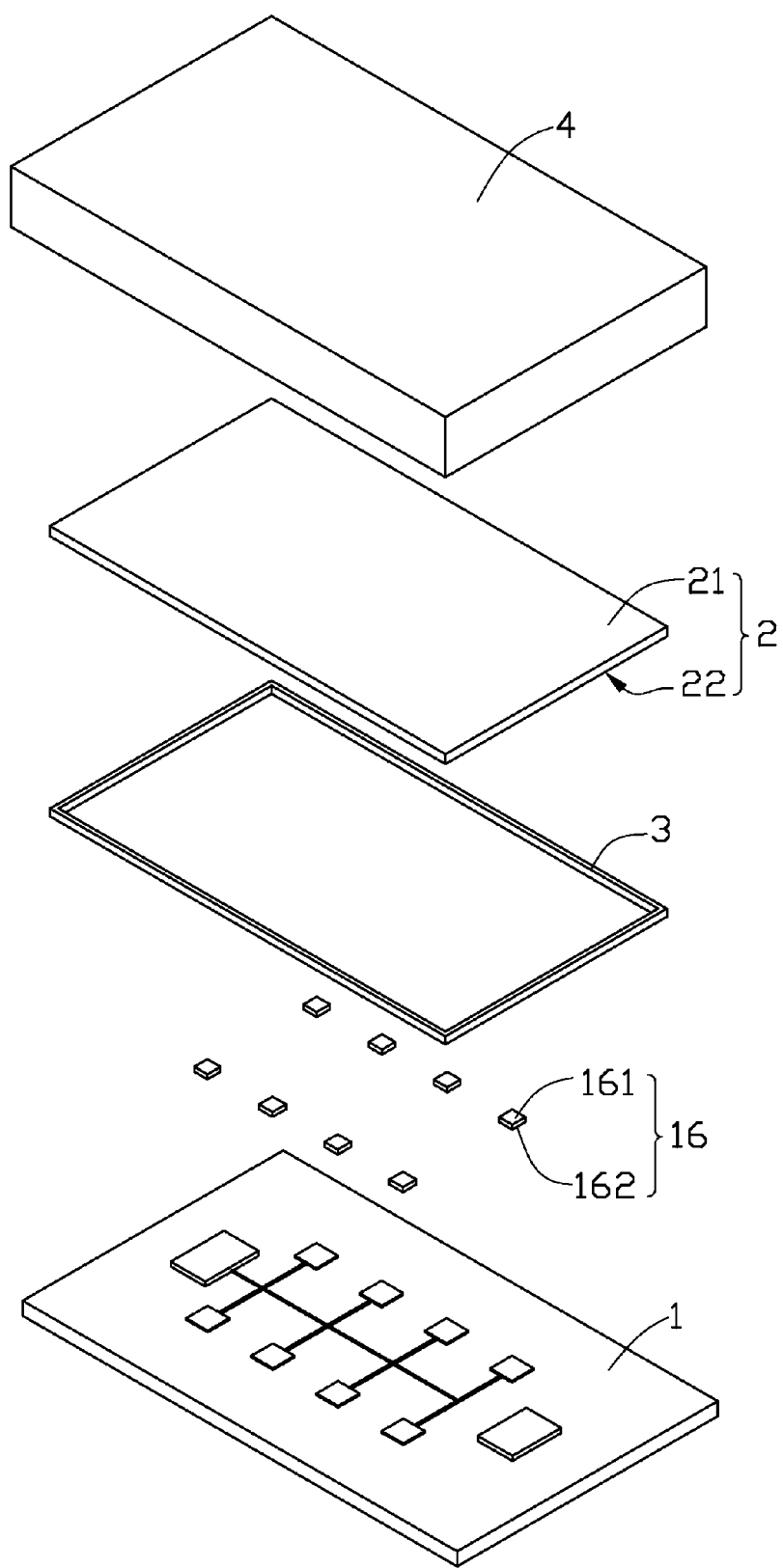
FIG. 1 is an isometric, exploded view of an LED light fixture according to an embodiment.

Referring to FIG. 1, an LED light fixture includes a first substrate 1, a second substrate 2, a sealing frame 3, a cover 4, and a plurality of LED chips 16.

Figure 2:
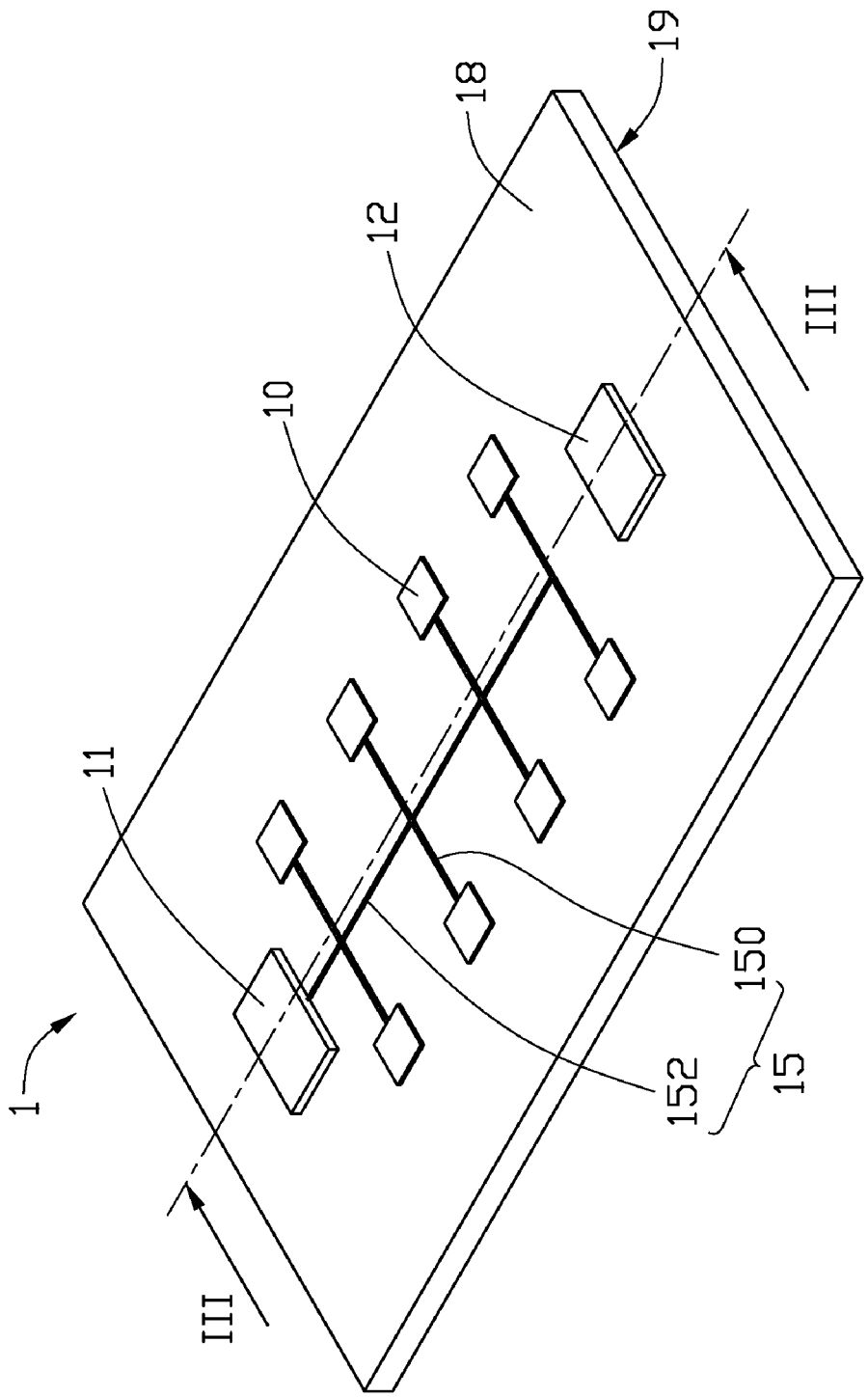
FIG. 2 is an enlarged view of a first substrate of the LED light fixture of FIG. 1.
Figure 3:
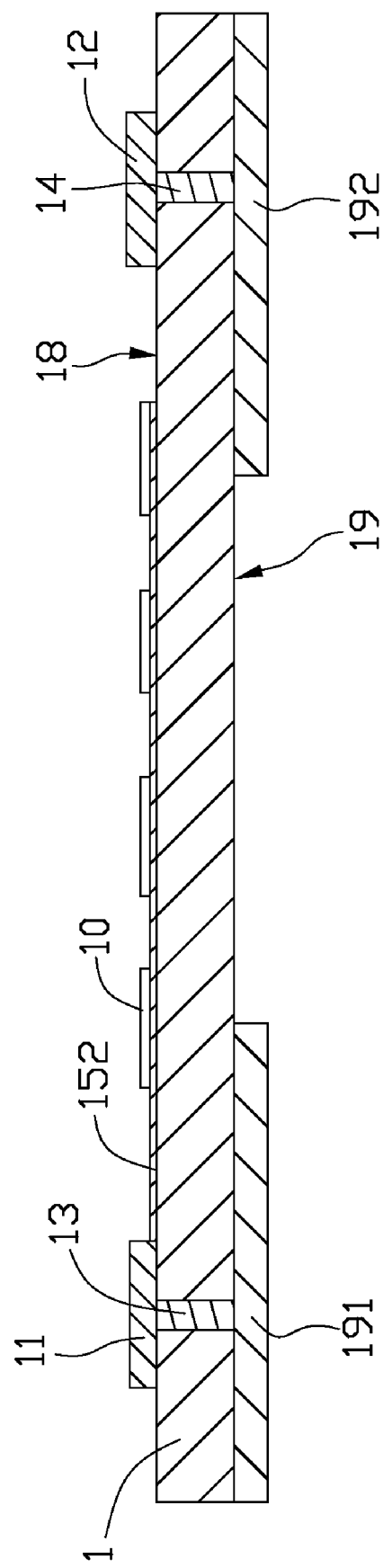
FIG. 3 is a cross section of the first substrate taken along line III-III of FIG. 2.

Referring to FIGS. 2 and 3, the first substrate 1 is a flat rectangular plate, which has a planar mounting surface 18 formed at a top side thereof and an outer surface 19 formed at a bottom side thereof. A first inner terminal 11 is formed on the mounting surface 18 of the first substrate 1 near a left edge of the first substrate 1, and a second inner terminal 12 is formed on the mounting surface 18 of the first substrate 1 near a right edge of the first substrate 1. A first outer terminal 191 is formed at the outer surface 19 of the first substrate 1 under the first inner terminal 11, and a second outer terminal 192 is formed at the outer surface 19 of the first substrate 1 under the second inner terminal 12. A first post 13 extends through the first substrate 1 and electrically interconnects the first inner terminal 11 and the first outer terminal 191. A second post 14 extends through the first substrate 1 and electrically interconnects the second inner terminal 12 and the second outer terminal 192.

A plurality of first electrodes 10 are formed on the mounting surface 18 of the first substrate 1. The number of first electrodes 10 is equal to the number of LED chips 16. In this embodiment, the first electrodes 10 are located between the first inner terminal 11 and the second inner terminal 12, arranged in two lines which extend from the left edge to the right edge of the first substrate 1. The first electrodes 10 of each line are evenly spaced from each other. All of the first electrodes 10 are electrically connected by first circuitry 15. In this embodiment, the first circuitry 15 includes several parallel wires 150 and a connecting wire 152. Each parallel wire 150 of the first circuitry 15 electrically interconnects one first electrode 10 of a line and a corresponding first electrode 10 of the other line. The connecting wire 152 of the first circuitry 15 is perpendicular to the parallel wires 150 and connected to a middle of each parallel wire 150 and has an end connected to the first inner terminal 11. Thus all of the first electrodes 10 of the first substrate 1 are electrically connected to the first outer terminal 191 through the first circuitry 15, the first inner terminal 11 and the first post 191. Conversely, the first electrodes 10 are insulated from the second inner terminal 12 and the second outer terminal 192.

Figure 4:
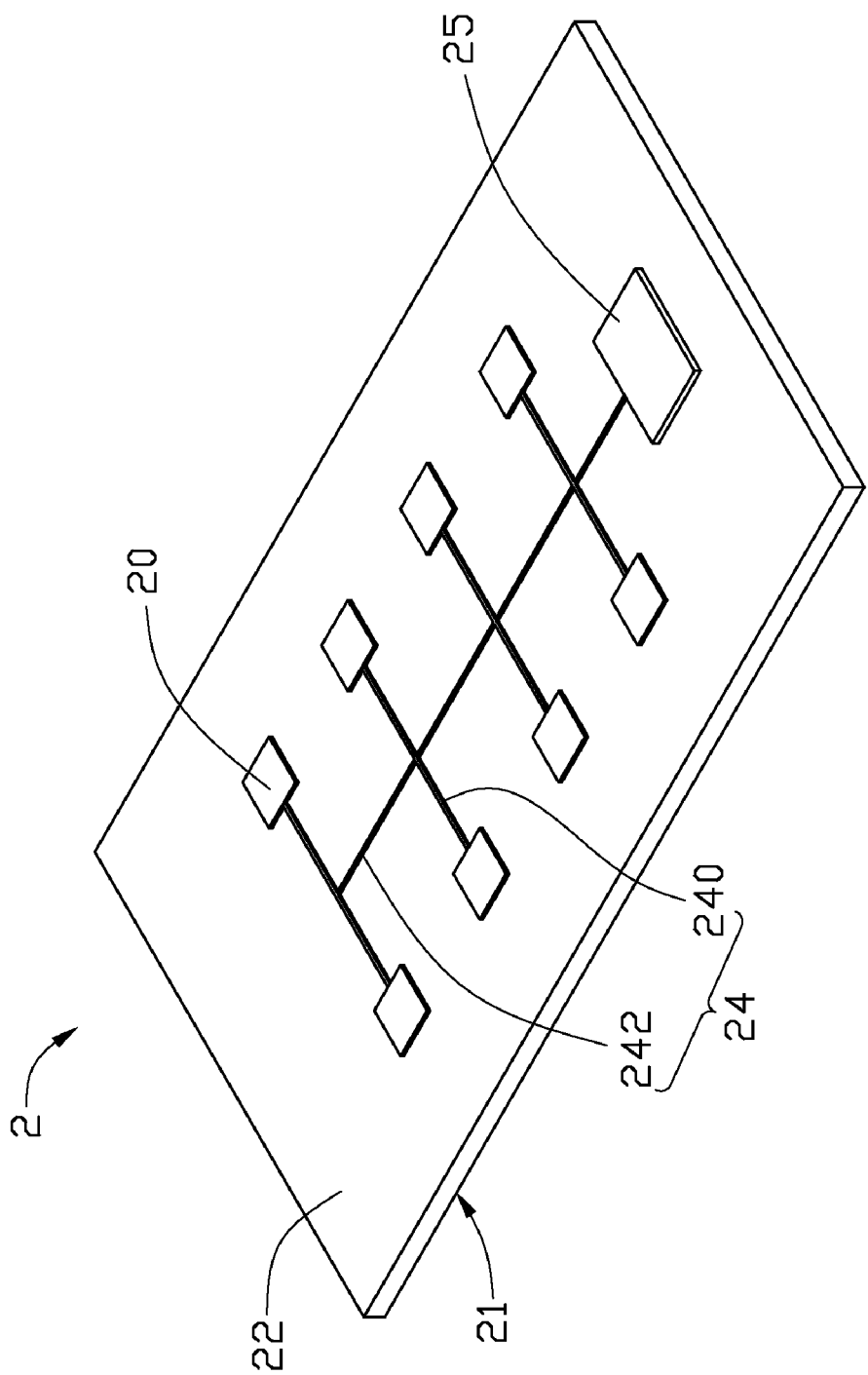
FIG. 4 is an isometric view of a second substrate of the LED light fixture viewed from a bottom aspect.

Referring to FIG. 4, the second substrate 2 is a flat rectangular plate similar to the first substrate 1. Outer dimensions of the second substrate 2 are less than those of the first substrate 1. The second substrate 2 is transparent material, such as epoxy resin, acryl or glass. The second substrate 2 has a planar mounting surface 22 formed at a bottom side thereof and an outer surface 21 at a top side thereof. A third inner terminal 25 is formed at a right side of the mounting surface 22 of the second substrate 2 corresponding to the second inner terminal 12 of the first substrate 1.

A plurality of second electrodes 20 is formed on the mounting surface 22 of the second substrate 2 corresponding to the first electrodes 10 of the first substrate 1. The number of second electrodes 20 is equal to the number of first electrodes 10, thus being equal to the number of LED chips 16. The second electrodes 20 are arranged in two lines corresponding to the first electrodes 10 of the first substrate 1. The second electrodes 20 of each line are evenly spaced from each other. All of the second electrodes 20 are electrically connected by second circuitry 24. The second circuitry 24 includes several parallel wires 240 and a connecting wire 242. Each parallel wire 240 of the second circuitry 24 electrically interconnects one second electrode 20 of a line and a corresponding second electrode 20 of the other line. The connecting wire 242 of the second circuitry 24 is perpendicular to the parallel lines 240 and connected to a middle of each parallel wire 240 and has an end connected to the third inner terminal 25. Thus all of the second electrodes 20 of the second substrate 2 are electrically connected to the third inner terminal 25 through the second circuitry 24.

Each of the plurality of LED chips 16 is a p-n junction structure, and includes a negative pole 161 connecting to one corresponding second electrode 20 and a positive pole 162 connecting to one corresponding first electrode 10; the negative and positive poles 161, 162 are formed at two opposite sides (i.e., top side and bottom side) of each LED chip 16, respectively.

Figure 5:
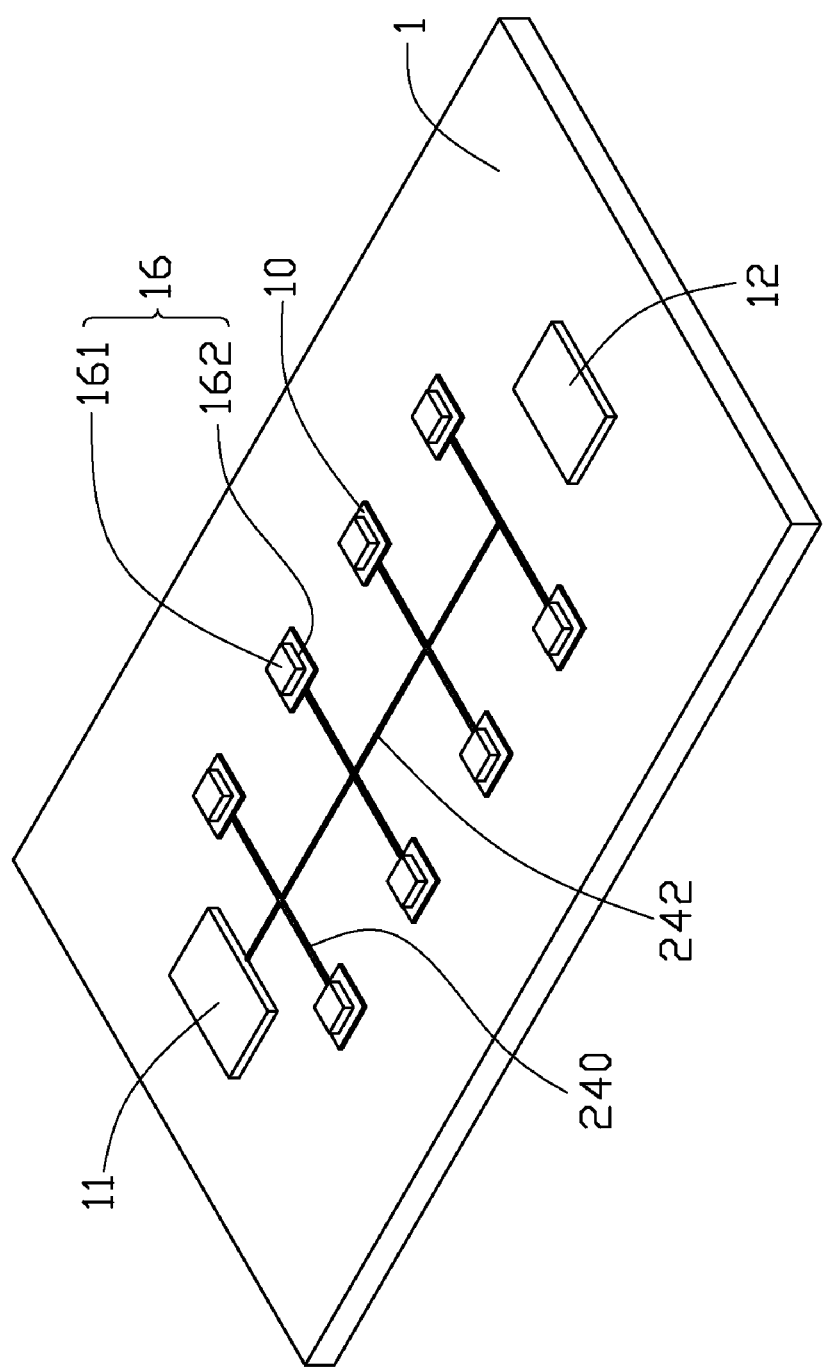
FIG. 5 shows a plurality of LED chips assembled onto the first substrate.

Referring to FIG. 5, to form the LED light fixture, firstly, the LED chips 16 are mounted onto the mounting surface 18 of the first substrate 1 with the positive poles 162 thereof respectively contacting the first electrodes 10. Thus the positive pole 162 of each LED chip 16 is connected electrically to the first outer terminal 191 through the corresponding first electrode 10, the first circuitry 15, the first inner terminal 11, and the first post 13.

Figure 6:
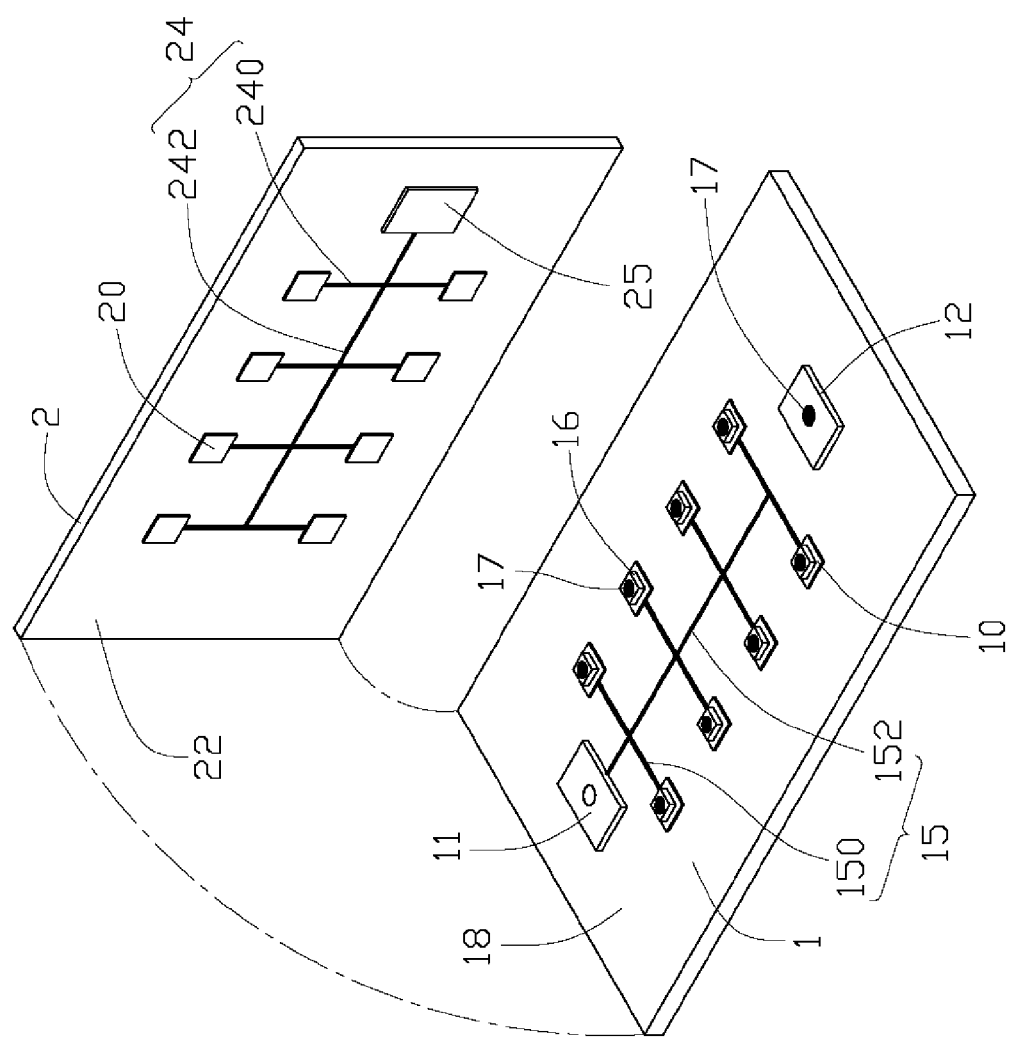
FIG. 6 shows assembly of the second substrate onto the first substrate after the LED chips are mounted on the first substrate.
Figure 7:
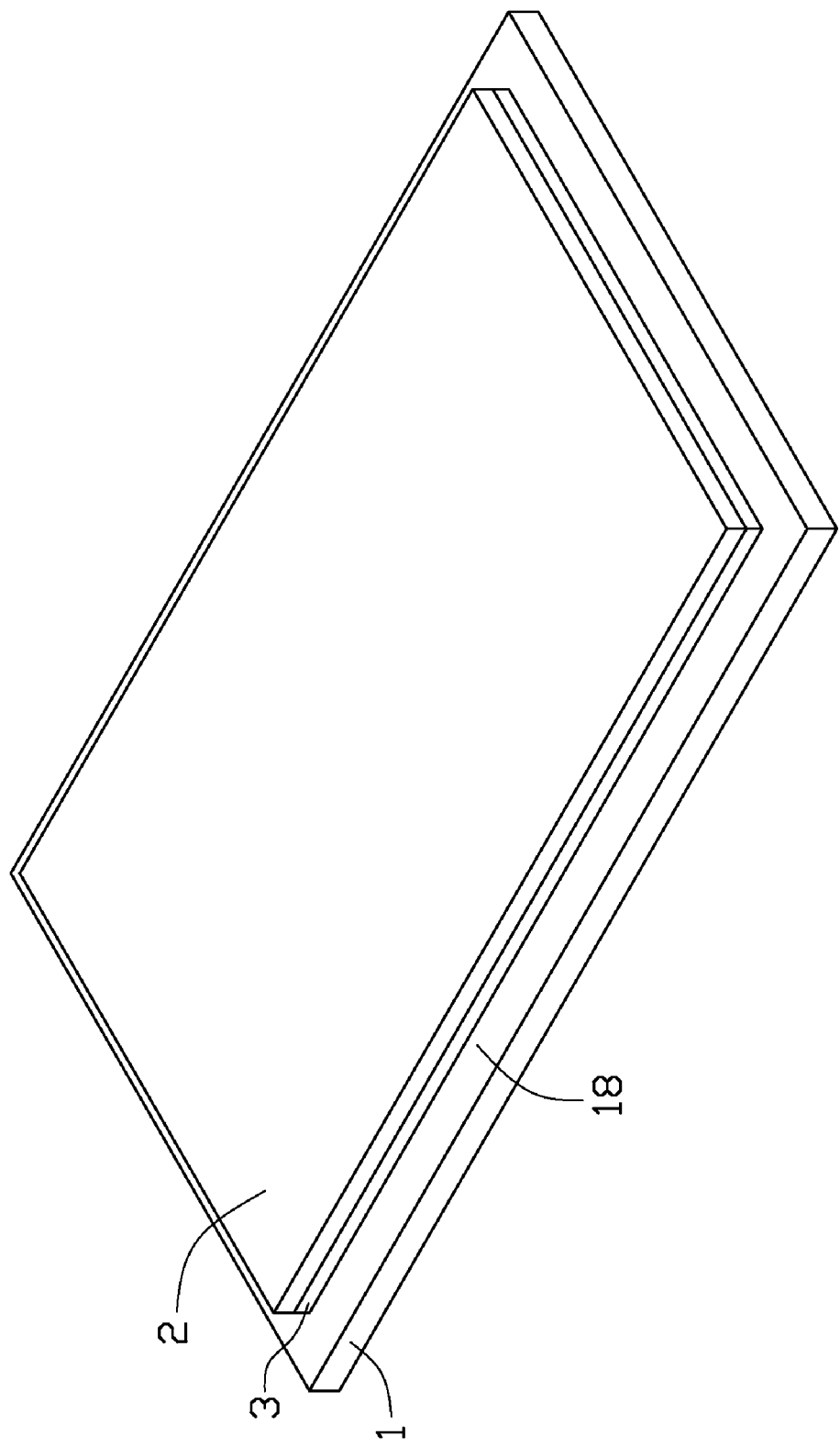
FIG. 7 shows a sealing frame formed between the first substrate and the second substrate after the second substrate is assembled onto the first substrate.

Referring to FIG. 6, after the LED chips 16 are mounted on the first electrodes 10, the second substrate 2 is mounted onto the first substrate 1 with the mounting surface 22 of the second substrate 2 and the mounting surface 18 of the first substrate 1 facing each other. As the outer dimensions of the second substrate 2 exceed those of the first substrate 1, an outer periphery of the first substrate 1 is exposed to the exterior (as shown in FIG. 7). The second electrodes 20 of the second substrate 2 are respectively located over the negative poles 161 of the LED chips 16, and the third inner terminal 25 of the second substrate 2 is located over the second inner terminal 12 of the first substrate 1.

A solder paste 17 is provided on the second inner terminal 12 to interconnect the third inner terminal 25 and the second inner terminal 12 electrically, and is provided on the negative pole 161 of each LED chip 16 to interconnect the negative pole 161 of each LED chip 16 and the corresponding second electrode 20 electrically. Thus all of the negative poles 161 of the LED chips 16 are connected electrically to the second outer terminal 192 through the second electrodes 20, the second circuitry 24, the third inner terminal 25, the second inner terminal 12 and the second post 14. Alternatively, the solder paste 17 can be provided on the second electrodes 20 of the second substrate 2 or on both of the second electrodes 20 and the negative poles 161 of the LED chips 16 for adhering the negative poles 161 and the second electrodes 20, and can be provided on the third inner terminal 25 of the second substrate 2 or on both the third inner terminal 25 and the second inner terminal 12 of the second substrate 1, adhering the third inner terminal 25 and the second inner terminal 12. In addition, the solder paste 17 can also be provided between the first electrodes 10 of the first substrate 1 and the positive poles 162 of the LED chips 16 before mounting the LED chips 16 on the first substrate 1, such as on the first electrodes 10, on the positive poles 162, and on both of the first electrodes 10 and the positive poles 162. Thus when the LED chips 16 attach to the first electrodes 10 of the first substrate 1, the LED chips 16 can be adhered to the solder paste to avoid movement thereof.

LED chips 16, the first substrate 1, and the second substrate 2 are securely fixed together by heating the solder paste 17 in a reflow oven, such as be an infrared oven. Thus the positive pole 162 and the negative pole 161 of each LED chip 16 are electrically connected to the first outer terminal 191 and the second outer terminal 192 of the outer surface 19 of the first substrate 1, respectively. During operation, a positive pole and a negative pole of a power source (not shown) are connected to the first outer terminal 191 and the second outer terminal 192, respectively, and current can thus be applied to the LED chips 16, generating light emission therefrom. Alternatively, the LED chips 16 can be inverted with the positive poles 162 connected to the second electrodes 20 of the second substrate 2 and the negative poles 161 connected to the first electrodes 10 of the first substrate 1. In this case, the first outer terminal 191 is electrically connected to the negative poles 161 of the LED chips 16, and the second outer terminal 192 is electrically connected to the positive poles 162 of the LED chips 16. Thus the positive pole and the negative pole of the power source (not shown) connect to the second outer terminal 192 and the first outer terminal 191, respectively.

Referring to FIG. 7, the sealing frame 3 is then provided between the first substrate 1 and the second substrate 2, sealing the LED chips 16 between the first substrate 1 and the second substrate 2 to protect the LED chips 16 from environmental harm and mechanical damage. Referring to FIG. 8, the cover 4 is attached to the mounting surface 18 of the first substrate 1 to form the LED light fixture. The cover 4 includes a transparent lens 43 and a flange 42. The transparent lens 43 is rectangular, being substantially equal in size to the first substrate 1 and arranged over the second substrate 2. The flange 42 extends perpendicularly from an outer periphery of the transparent lens 43, and abuts the outer periphery of the mounting surface 18 of the first substrate 1. Thus the LED chips 16, the second substrate 2 and the sealing frame 3 are received in a space defined between the cover 4 and the first substrate 1. Light emitted from the LED chips 16 passes across the second substrate 2, and the lens 43 of the cover 4 to outside. The lens 43 can converge the light of the LED chips 16, whereby light emitted from the lens 43 is substantially parallel, improving directionality of the LED light fixture.

As the first substrate 1 and the second substrate 2 are formed with a plurality of electrodes 10, 20 and terminal/terminals 11, 12, 25, 191, 192 electrically connected with the electrodes 10, 20, the plurality of LED chips 16 can be assembled to and electrically connected to the electrodes 10, 20 at the same time. The LED chips 16 can subsequently be encapsulated simultaneously by the sealing frame 3 or/and the cover 4. Accordingly, wire bonding and encapsulation processes for each LED normally associated with manufacture of a conventional LED lamp are avoided. Production efficiency of the LED light fixture is thus improved, and production costs thereof reduced.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An LED light fixture, comprising:
   a first substrate comprising a mounting surface and an opposite outer surface, a plurality of spaced first electrodes, a first inner terminal electrically connected to the first electrodes and a second inner terminal insulated from the first electrodes formed on the mounting surface of the first substrate, and a first outer terminal electrically connected to the first inner terminal and a second outer terminal electrically connected to the second inner terminal, the first and second outer terminals being formed on the outer surface of the first substrate;
   a second substrate comprising a mounting surface facing the mounting surface of the first substrate, a plurality of spaced second electrodes formed on the mounting surface of the second substrate corresponding to the first electrodes of the first substrate, and a third inner terminal formed on the mounting surface of the second substrate, electrically connected to the second electrodes and the second inner terminal; and
   a plurality of LED chips arranged between the first substrate and the second substrate, with positive poles of the LED chips respectively connected to one of the first electrodes and the second electrodes, and negative poles of the LED chips respectively connected to the other of the first electrodes and the second electrodes.

2. The LED light fixture of claim 1, further comprising a sealing frame arranged between the first substrate and the second substrate to seal the LED chips between the first substrate and the second substrate.

3. The LED light fixture of claim 1, further comprising a transparent cover attached to the first substrate, the cover comprising a lens facing the second substrate and a flange extending from a periphery of the lens to the first substrate, the second substrate being transparent.

4. The LED light fixture of claim 3, wherein the second substrate is smaller than the first substrate, and the flange of the cover attaches to a periphery of the mounting surface of the first substrate.

5. The LED light fixture of claim 1, further comprising a first post extending through the first substrate and interconnecting the first inner terminal and the first outer terminal, and a second post extending through the first substrate and interconnecting the second inner terminal and the second outer terminal.

6. The LED light fixture of claim 1, wherein the first inner terminal and the second inner terminal are formed adjacent two opposite edges of the mounting surface of the first substrate, and the first electrodes are located between the first inner terminal and the second inner terminal.

7. The LED light fixture of claim 1, wherein the LED chips are arranged in two lines, the first electrodes are arranged in two lines corresponding to the LED chips, and the second electrodes are arranged in two lines corresponding to the LED chips.

8. The LED light fixture of claim 7, wherein the first electrodes and the first inner terminal are connected by first circuitry which comprises a plurality of parallel lines connected between the two lines of first electrodes, and a connecting wire connected to the parallel wires and having an end connected to the first inner terminal.

9. The LED light fixture of claim 7, wherein the second electrodes and the third inner terminal are connected by second circuitry which comprises a plurality of parallel lines connected between the two lines of second electrodes, and a connecting wire connected to the parallel wires and having an end connected to the third inner terminal.

10. A method for manufacturing an LED light fixture comprising a plurality of LED chips, the method comprising:
providing a first substrate comprising a mounting surface and an opposite outer surface, forming a plurality of spaced first electrodes, a first inner terminal electrically connected to the first electrodes, and a second inner terminal insulated from the first electrodes on the mounting surface of the first substrate, and forming a first outer terminal electrically connected to the first inner terminal and a second outer terminal electrically connected to the second inner terminal, the first and second outer terminals being formed on the outer surface of the first substrate;
providing a plurality of LED chips each comprising a positive pole and a negative pole, and attaching the plurality of LED chips onto the first electrodes with one of the positive poles and the negative poles connected to the first electrodes, respectively;
providing a second substrate having a mounting surface forming a plurality of spaced second electrodes thereon corresponding to the first electrodes of the first substrate and a third inner terminal corresponding to the second inner terminal of the first substrate;
mounting the second substrate to the first substrate with the third inner terminal connected to the second inner terminal and the second electrodes of the second substrate respectively connected to the other of the positive poles and the negative poles of the LED chips; and
sealing the first substrate and the second substrate to encapsulate the LED chips therebetween.

11. The method of claim 10, wherein the first substrate and the second substrate are sealed by a sealing framed arranged between the first substrate and the second substrate.

12. The method of claim 10, further comprising providing a lens and arranging the lens over the second substrate.

13. The method of claim 10, further comprising providing solder paste on at least one of the third inner terminal and the second inner terminal to assemble the third inner terminal and the second inner terminal through heating.

14. The method of claim 10, further comprising providing solder paste on at least one of the second electrodes of the second substrate and the other of the positive poles and the negative poles of the LED chips to assemble the LED chips and the second electrodes through heating.

15. The method of claim 10, further comprising providing a solder paste on at least one of the first electrodes of the first substrate and the positive poles and the negative poles of the LED chips to assemble the LED chips and the first electrodes through heating.

* * * * *